(12) United States Patent
Raynham

(10) Patent No.: US 6,978,352 B2
(45) Date of Patent: Dec. 20, 2005

(54) MEMORY CONTROLLER EMULATOR FOR CONTROLLING MEMORY DEVICES IN A MEMORY SYSTEM

(75) Inventor: Michael B. Raynham, Los Gatos, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 883 days.

(21) Appl. No.: 09/848,019

(22) Filed: May 3, 2001

(65) Prior Publication Data

US 2002/0165706 A1 Nov. 7, 2002

(51) Int. Cl.⁷ ............................................. G06F 13/00
(52) U.S. Cl. ......................... 711/154; 714/25; 714/30; 714/42
(58) Field of Search ........................ 711/154; 714/30, 714/25, 42

(56) References Cited

U.S. PATENT DOCUMENTS 6,381,715 B1 * 4/2002 Bauman et al. ............. 714/718

OTHER PUBLICATIONS

"Stub Series Terminated Logic for 2.5 Volts (SSTL-2)," Joint Electron Device Engineering Council (JEDEC), September 1998.

* cited by examiner

Primary Examiner—Reba I. Elmore

(57) ABSTRACT

A memory controller emulator for controlling memory devices in a memory system includes a counter for generating a plurality of address values. A plurality of storage devices for storing memory address information, memory data to be stored in the memory devices, and memory commands for controlling operation of the memory devices, are coupled to the counter. Each of the plurality of storage devices is configured to output data stored therein based upon address values received from the counter.

30 Claims, 4 Drawing Sheets

MEMORY CONTROLLER EMULATOR FOR CONTROLLING MEMORY DEVICES IN A MEMORY SYSTEM

THE FIELD OF THE INVENTION

The present invention relates to testing of memory systems. More particularly, the invention relates to a memory controller emulator for testing memory systems.

BACKGROUND OF THE INVENTION

There are a couple of existing solutions for testing memory systems. First, standard testing can be performed on a memory system that has been completely constructed, including a fully functional memory controller and dual in-line memory modules (DIMMs). However, if the memory system has not been constructed, testing is typically limited to testing of individual dynamic RAM (DRAM) chips, or DRAM chips and support chips on standard memory modules. Such testing is typically performed by a production memory tester, which is a very costly system. In addition to the high cost, another problem with this approach is that the production memory tester tests memory devices in an environment that is different than an actual memory system. A production memory tester typically uses a simplified test "lumped" load, whereas the actual load in a memory system is a transmission line with "distributed" loads along it, such as DIMMs, a memory controller, terminators, and other loads. This frequently causes problems since the memory supplier publishes a data sheet with timing parameters that may differ from the parameters of an actual system.

It would be desirable to provide a memory controller emulator that would allow testing of a memory system to be performed before the actual memory system has been completely constructed.

SUMMARY OF THE INVENTION

One form of the present invention provides a memory controller emulator for controlling memory devices in a memory system. The memory controller emulator includes a counter for generating a plurality of address values. A plurality of storage devices for storing memory address information, memory data to be stored in the memory devices, and memory commands for controlling operation of the memory devices, are coupled to the counter. Each of the plurality of storage devices is configured to output data stored therein based upon address values received from the counter.

Another form of the present invention provides a method of emulating a memory controller for controlling memory devices in a memory system. Memory address information, memory data to be stored in the memory devices, and memory commands for controlling operation of the memory devices, are stored. A plurality of sequential values are automatically generated. Stored memory address information, memory data, and memory commands, are output based upon the generated sequential values.

Another form of the present invention provides a memory controller emulator including at least one storage device for storing signal information representing signals transmitted from a memory controller to a memory module. An address generator is coupled to the at least one storage device. The address generator is configured to output address information. The at least one storage device is configured to output signal information based upon address information received from the address generator.

DESCRIPTION OF THE PREFERRED EMBODIMENTS

In the following detailed description of the preferred embodiments, reference is made to the accompanying drawings that form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
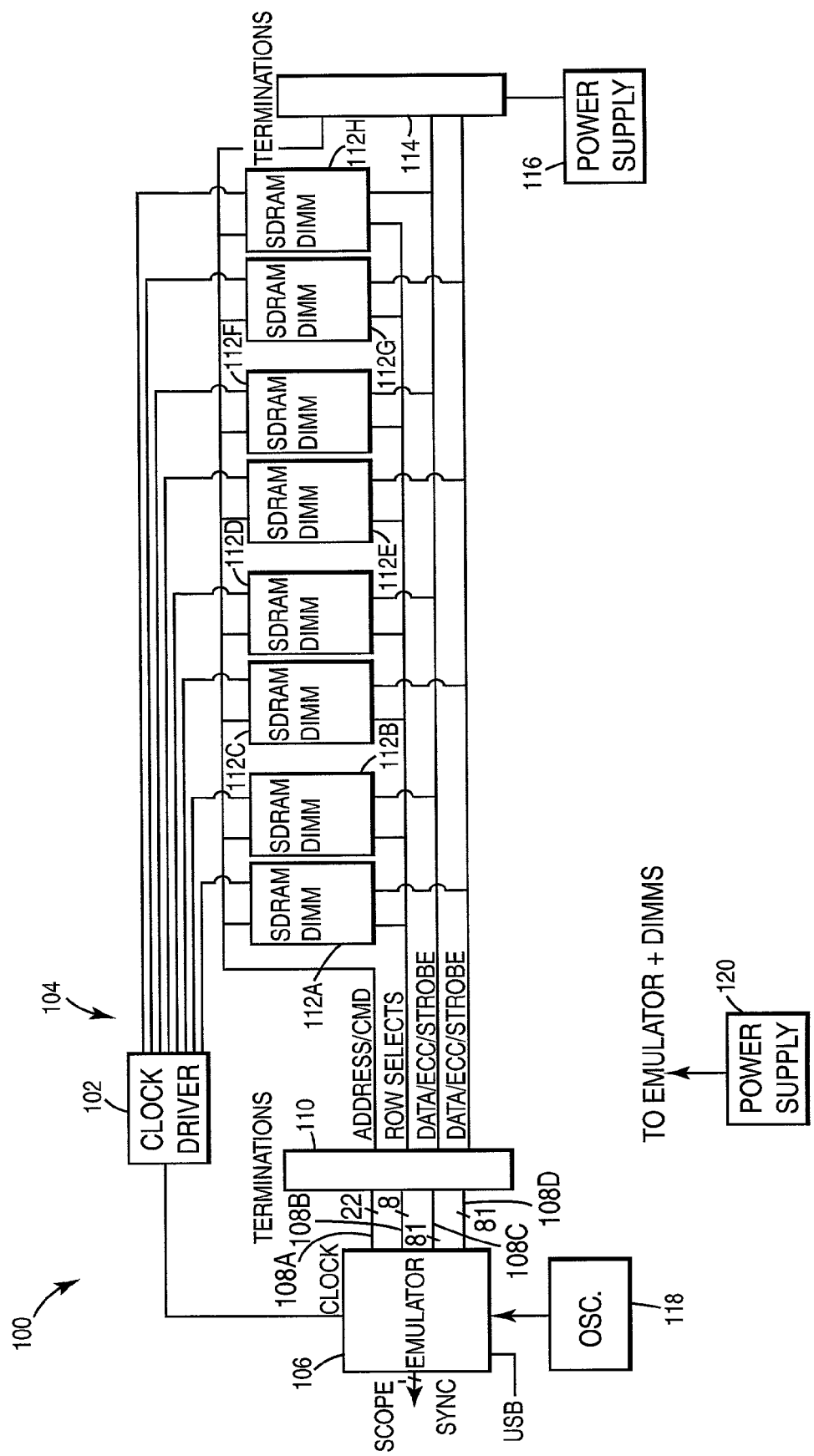
FIG. 1 shows an electrical block diagram illustrating a memory system, including a memory controller emulator according to one embodiment of the present invention.

FIG. 1 shows an electrical block diagram illustrating a memory system, including a memory controller emulator according to one embodiment of the present invention. Memory system 100 includes clock driver 102, memory controller emulator 106, terminations 110, synchronous dynamic RAM (SDRAM) dual in-line memory modules (DIMMs) 112A–112H (collectively referred to as SDRAM DIMMs 112), terminations 114, termination voltage supply 116, oscillator 118, and power supply 120. In one embodiment, memory system 100 is implemented on a printed circuit board (PCB), which includes memory sockets for SDRAM DIMMs 112, memory bus traces, and memory buffers, if needed. In one form of the invention, memory controller emulator 106 is a programmable logic device (PLD). Memory controller emulator 106 includes a universal serial bus (USB) input, which may be connected to a computer (not shown), such as an NT workstation, to change the design of emulator 106 "on the fly." In one embodiment, SDRAM DIMMs 112 each includes double data rate (DDR) SDRAM chips. In one form of the present invention, memory system 100 is compliant with the "Stub Series Terminated Logic for 2.5 Volts (SSTL-2)" standard published by the Joint Electron Device Engineering Council (JEDEC).

Memory controller emulator 106 includes output lines 108A–108D (collectively referred to as output lines 108), which are coupled to terminations 110. Terminations 110 and 114 include termination resistors to help prevent undesirable signal reflections. In one embodiment, terminations 110 use series terminations and terminations 114 use parallel terminations. Emulator 106 includes a 1 bit scope sync output, which may be coupled to an oscilloscope (not shown) for testing purposes. Emulator 106 includes a clock output, which is connected to clock driver 102. Emulator 106 is coupled to oscillator 118, which, in one embodiment, provides a 100 MHz clock signal to emulator 106. Emulator 106 is powered by power supply 120, which also supplies power to SDRAM DIMMs 112. In one embodiment, power supply 120 is a 2.5 volt power supply.

In one embodiment, lines 108A are address/command (CMD) outputs, and include a total of 22 output lines; lines 108B are row select outputs, and include a total of 8 output lines; lines 108C are data/error correction codes (ECC)/strobe outputs, and include a total of 81 output lines; and lines 108D are also data/ECC/strobe outputs, and include a total of 81 output lines.

Address/CMD lines 108A are coupled to each one of the SDRAM DIMMs 112, and are used by emulator 106 to output address information (including bank address information, row address information, and column address information) and command information to SDRAM DIMMs 112. Address/CMD lines 108A are terminated at terminations 114. Terminations 114 are coupled to power supply 116, which provides a termination voltage. In form of the invention, power supply 116 provides a 1.5 volt termination voltage. Row select lines 108B are coupled to each one of the SDRAM DIMMs 112, and are used by emulator 106 to output chip selection information to SDRAM DIMMs 112. In one embodiment, SDRAM DIMMs 112 each include two rows of memory chips. The 8 bit chip selection information carried on row select lines 108B allows emulator 106 to select one of the two rows of memory chips on each SDRAM DIMM 112. Data/ECC/Strobe lines 108C are coupled to SDRAM DIMMs 112B, 112D, 112F, and 112H, and are used by emulator 106 to send data, ECC information, and strobe signals. Data/ECC/Strobe lines 108D are coupled to SDRAM DIMMs 112A, 112C, 112E, and 112G, and are used by emulator 106 to send data, ECC information, and strobe signals. Data/ECC/Strobe lines 108C and 108D are terminated at terminations 114.

In one embodiment, data/ECC/strobe output lines 108C and 108D each include 64 output lines for data, 8 output lines for ECC information, and 9 output lines for strobe signals (i.e., one strobe per byte of data). Thus, in one form of the invention, memory system 100 is a 144 bit wide memory system (128 data bits and 16 ECC bits). In alternative embodiments, other memory configurations may be used.

Memory controller emulator 106 outputs a clock signal to differential clock driver 102. In one embodiment, the clock signal output to clock driver 102 is a 100 MHz clock signal. Based on the received clock signal from emulator 106, clock driver 102 outputs 8 100 MHz differential clock pair signals 104, with one pair of differential clock signals being coupled to each one of the SDRAM DIMMs 112.

Figure 2:
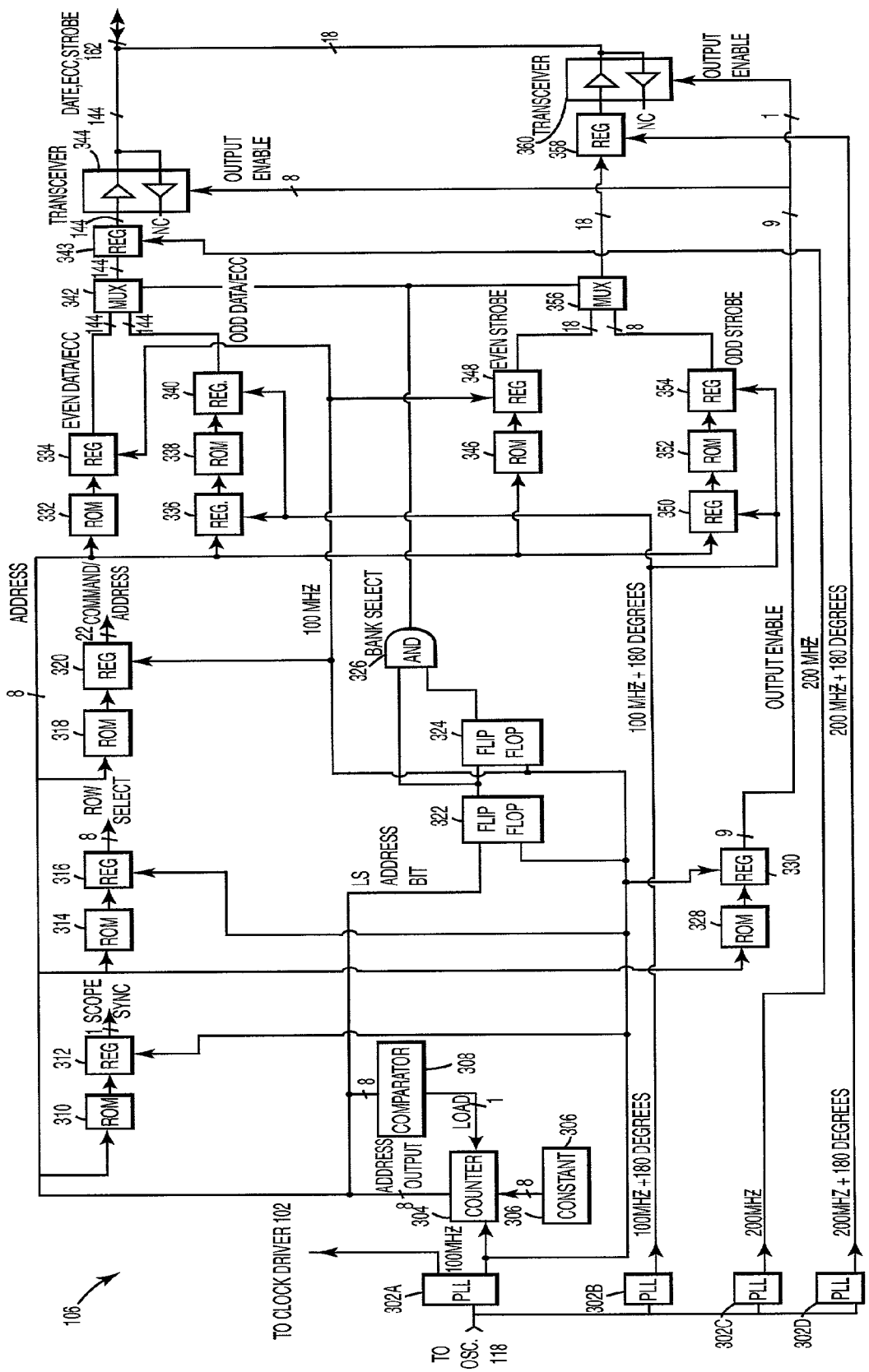
FIG. 2 shows an electrical block diagram illustrating a memory controller emulator according to one embodiment of the present invention.
Figure 3A:
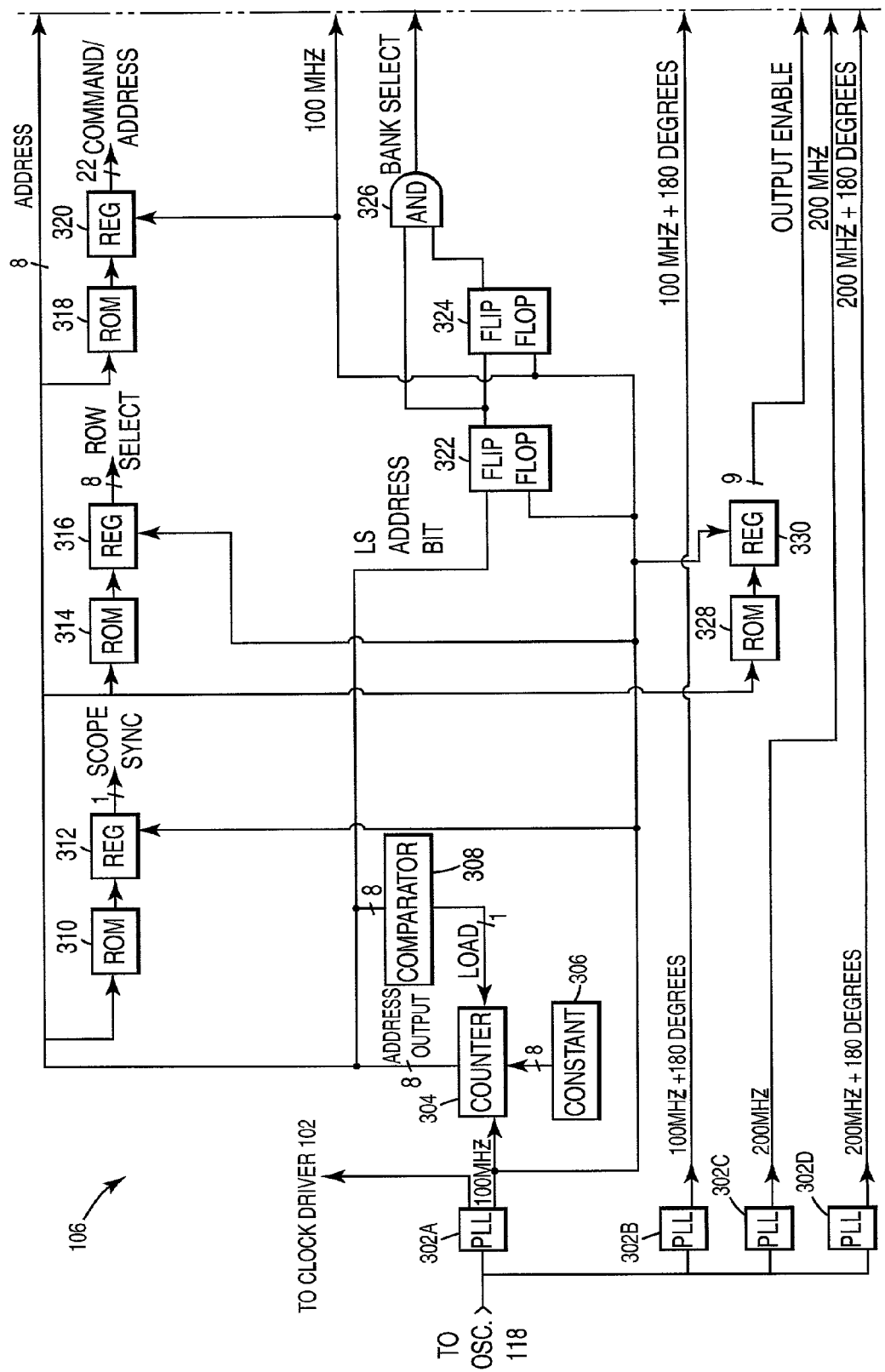
FIG. 3A shows an enlarged view of a first portion of the electrical block diagram shown in FIG. 2.
Figure 3B:
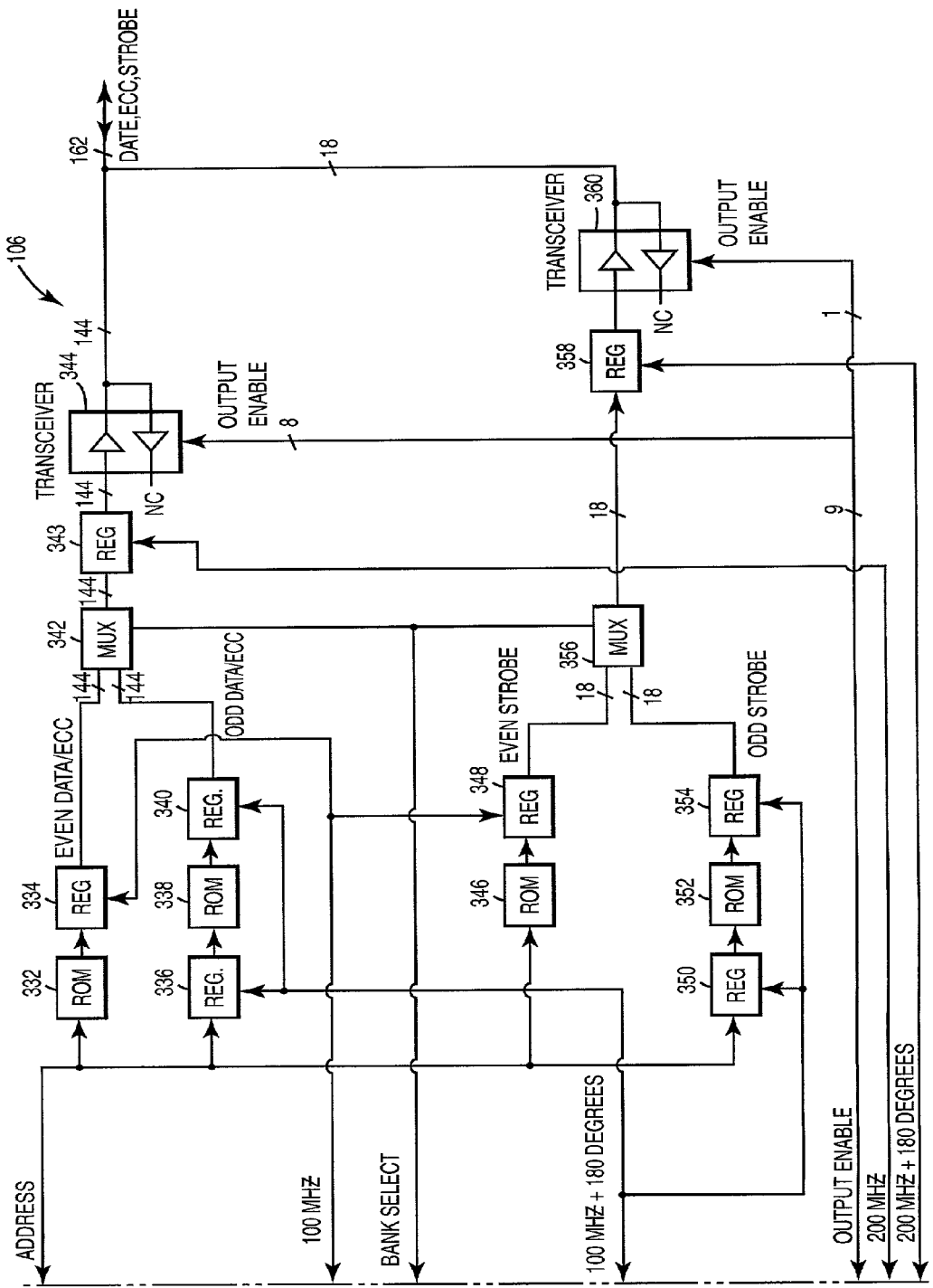
FIG. 3B shows an enlarged view of a second portion of the electrical block diagram shown in FIG. 2.

FIG. 2 shows an electrical block diagram illustrating a memory controller emulator according to one embodiment of the present invention. Memory controller emulator 106 includes phase-locked loops (PLLs) 302A–302D (collectively referred to as PLLs 302), counter 304, constant 306, comparator 308, ROM 310, register 312, ROM 314, register 316, ROM 318, register 320, flip-flops 322 and 324, AND gate 326, ROM 328, register 330, ROM 332, registers 334 and 336, ROM 338, register 340, multiplexer (MUX) 342, register 343, transceiver 344, ROM 346, registers 348 and 350, ROM 352, register 354, multiplexer 356, register 358, and transceiver 360. The block diagram shown in FIG. 2 is divided into two enlarged views in FIGS. 3A and 3B, which may be placed end-to-end to illustrate the complete block diagram.

PLLs 302 are coupled to oscillator 118 (shown in FIG. 1), and receive a 100 MHz clock signal from oscillator 118. PLL 302A outputs a 100 MHz clock signal to clock driver 102 (shown in FIG. 1), counter 304, registers 312 and 316, flip-flops 322 and 324, and registers 320, 348, and 334. PLL 302B outputs a 100 MHz clock signal phase shifted by +180 degrees to registers 336, 340, 350, and 354. PLL 302C outputs a 200 MHz clock signal to register 343. PLL 302D outputs a 200 MHz clock signal phase shifted by +180 degrees to register 358. In one embodiment, the phase shift of each PLL 302 may be individually varied to change the memory timing relative to the 100 MHz clock signal provided by oscillator 118.

In one embodiment, counter 304 is an 8 bit counter that cycles through 256 addresses. A start and an end address are programmable by modifying constant 306 and comparator 308, which allows cycling to occur between N and M, where N and M represent integer values in the range of 0 to 255. A start address is provided by constant 306. An end address is provided by comparator 308. As counter 304 cycles through addresses, comparator 308 compares each address with a stored end address. When counter 304 reaches the stored end address, comparator 308 outputs a 1 bit "load" signal to counter 304, which causes the start address stored in constant 306 to be loaded into counter 304. Counter 304 then begins counting from the loaded start address.

In one embodiment, ROMs 310, 314, 318, and 328, each has the same number of addresses as counter 304 (e.g., 256 addresses), and an output width corresponding to the given function (e.g., scope sync =1 bit, row select =8 bits, command/address =22 bits, and output enable =9 bits). Registers 312, 316, 320, and 330, are coupled to ROMS 310, 314, 318, and 328, respectively, and latch the output of their respective ROM at a positive clock transition (i.e., positive edge) from the clock signal provided by PLL 302A.

Register 312 outputs a 1 bit scope synchronization signal, which may be coupled to an oscilloscope (not shown) for testing purposes. Register 316 outputs an 8 bit row select value, which is output on output line 108B (shown in FIG. 1). Register 320 outputs a 22 bit address/CMD value, which is output on output line 108A (shown in FIG. 1). In one embodiment, the 22 bit address/CMD value output by register 320 includes 2 bits for clock enable signals, 3 bits for bank address, 3 bits for row address strobe (RAS), column address strobe (CAS), and write enable (WE), which are command select bits for selecting memory chip commands such as ACTIVE, READ, and WRITE, and 14 bits for column and row addresses. Register 330 outputs a 9 bit output enable value, with 8 bits being provided to transceiver 344, and 1 bit being provided to transceiver 360. The output enable bits output by register 330 are used to enable and disable output from transceivers 344 and 360.

ROMs 332 and 338 each has the same number of addresses as counter 304 (e.g., 256 addresses), and each has an output width of 144 bits. The 144 bits output by each ROM 332 and 338 includes 128 bits for data and 16 bits for ECC. In one embodiment, data is stored in even and odd banks to produce the necessary data rates. Data stored in ROM 332 represents even bank data, and data stored in ROM 338 represents odd bank data. The input of ROM 332 is coupled to counter 304. Register 334 is coupled to an output of ROM 332, and latches the output of ROM 334 (even data/ECC) at a positive clock transition from the clock signal provided by PLL 302A. ROM 338 is coupled to an input register 336 and an output register 340. Registers 336 and 340 are coupled to PLL 302B, which provides a 100 MHz clock signal that is +180 degrees out of phase with the 100 MHz clock signal provided by PLL 302A. Register 336 latches the address from counter 304 at a positive clock transition from the clock signal provided by PLL 302B. Register 340 latches the output of ROM 338 (odd data/ECC) at a positive clock transition from the clock signal provided by PLL 302B. The 144 bit outputs of registers 334 and 340 are coupled to multiplexer 342.

Like the data and ECC information, strobe signals are also placed in even and odd banks in one embodiment, to produce the necessary data rates. Strobe signals are stored in ROMs 346 and 352. ROMs 346 and 352 each has the same number of addresses as counter 304 (e.g., 256 addresses), and each has an output width of 18 bits. Data stored in ROM 346 represents even bank strobes, and data stored in ROM 352 represents odd bank strobes. The input of ROM 346 is coupled to counter 304. Register 348 is coupled to an output of ROM 346, and latches the output of ROM 346 (even bank strobes) at a positive clock transition from the clock signal provided by PLL 302A. ROM 352 is coupled to an input register 350 and an output register 354. Registers 350 and 354 are coupled to PLL 302B, which provides a 100 MHz clock signal that is +180 degrees out of phase with the 100 MHz clock signal provided by PLL 302A. Register 350 latches the address from counter 304 at a positive clock transition from the clock signal provided by PLL 302B. Register 354 latches the output of ROM 352 (odd bank strobes) at a positive clock transition from the clock signal provided by PLL 302B. The 18 bit outputs of registers 348 and 354 are coupled to multiplexer 356.

Multiplexers 342 and 356 each output one of their two inputs based on a bank select signal output by AND gate 326. The two inputs of AND gate 326 are coupled to the outputs of flip-flop 322 and flip-flop 324. The input of flip-flop 322 is coupled to the least significant (LS) address bit output by counter 304. The input of flip-flop 324 is coupled to the output of flip-flop 322. Flip-flops 322 and 324 are both coupled to PLL 302A, for receiving a 100 MHz clock signal. In one embodiment, when the output of AND gate 326 is high, multiplexers 342 and 356 output data/ECC and strobe signals from the even bank (i.e., data/ECC from register 334 and strobe signals from register 348). When the output of AND gate 326 is low, multiplexers 342 and 356 output data/ECC and strobe signals from the odd bank (i.e., data/ECC from register 340 and strobe signals from register 354).

The output of multiplexer 342 is coupled to register 343. Register 343 is coupled to PLL 302C, which provides a 200 MHz clock signal. Register 343 latches the received data from multiplexer 342 at a positive clock transition of the clock signal provided by PLL 302C. Thus, data/ECC bits are output at a rate of 200 MHz.

The output of multiplexer 356 is coupled to register 358. Register 358 is coupled to PLL 302D, which provides a 200 MHz clock signal that is phase shifted by +180 degrees from the 200 MHz clock signal output by PLL 302C. Register 358 latches the received strobe signals from multiplexer 356 at a positive clock transition of the clock signal provided by PLL 302D. Thus, the strobe signals are output at a rate of 200 MHz, and are phase shifted by 180 degrees relative to the data/ECC signals.

The outputs of registers 343 and 358 are coupled to transceivers 344 and 360, respectively. In one embodiment, transceivers 344 and 360 are tri-state transceivers. The outputs of transceivers 344 and 360 are enabled and disabled by signals from ROM 328 and register 330. When enabled, transceiver 344 outputs 144 data/ECC bits from register 343. When enabled, transceiver 360 outputs 18 bits of strobe signals. The 144 data/ECC bits and the 18 bits of strobe signals combine to form a total of 162 data/ECC/strobe bits. The 162 data/ECC/strobe bits are output on two 81 bit lines 108C and 108D (shown in FIG. 1) to SDRAM DIMMs 112. In one embodiment, transceivers 344 and 360 are only configured for transmitting information to SDRAM DIMMs 112, and not for receiving information from SDRAM DIMMs 112. Thus, the receiving circuitry in transceivers 344 and 360 is not connected (NC). However, the read data from the SDRAM DIMMs 112 can be measured at the input pins for testing purposes. In an alternative embodiment, memory controller emulator 106 is configured to send and receive information from SDRAM DIMMs 112.

The various registers coupled to ROMs in memory controller emulator 106 act as pipeline registers to minimize clock to output time. It may be necessary to use additional input and output registers with the ROMs to replicate some memory controller signals and function at the desired speed.

As shown in FIG. 1, memory controller emulator 106 includes a universal serial bus (USB) input. The USB input may be connected to a computer (not shown), such as an NT workstation, to change the design of the emulator 106 "on the fly." Changes may be made to support different memory systems, memory modules, memory sequences, or data patterns. The data in any of the ROMs 310, 314, 318, 328, 332, 338, 346, and 352, may be changed by the workstation by editing the ".mif" data files, address files, and command files for the ROMs, and then downloading the revised design to emulator 106. This allows any read/write combination, including the initialization sequence shown in the JEDEC specification for DDR SDRAMs, to be produced by appropriately setting the ROM bits.

The scope sync output of emulator 106 (stored in ROM 310) facilitates stable monitoring of a specific memory cycle within a sequence. The scope sync output from emulator 106 may be coupled to an oscilloscope to control data collection, and perform automated waveform measurements and statistical analyses of jitter, skew, and a qualitative measure know as the "eye." Jitter is associated with clock generators, and results in random movement in the clock edge from its expected position, due to the phase-locked loop circuits currently used in most clock generators. The jitter from the clock distribution chip has to be accounted for in the timing budget. Also, memory modules usually have phase-locked loops that regenerate the clock, and these phase lock loops also introduce jitter that must be allowed for in the timing budget. Skew occurs primarily in the clock distribution, where a clock generator with multiple outputs may have signal traces that are not exactly matched, which results in different propagation delays. The total skew is subtracted from the clock period to obtain the worst case for meeting data propagation, set-up and hold times. "Eye" is a qualitative test of system hold time and set-up time, wherein the received data is compared to the clock edge when accumulated over a relatively long period of time. The middle of the resulting "eye" should be open. If the resulting "eye" is closed, this typically indicates a problem with the set-up and/or hold time.

One important application of memory controller emulator 106 is for comparing the waveforms in an actual memory system with that in a simulated system, which uses electrical models for all components. This allows the accuracy of the simulation models to be assessed. A system simulation is usually used to predict the effects of changing many system variables on the timing and noise margins, which cannot be practically done by measurement alone in a typical system. Using memory system 100, timing can be compared to the theoretical timing budget, and noise margins can be compared to the theoretical noise margins. System timing can be modified for margin testing by modifying PLLs 302 to generate different frequencies and different phase shifts. Margin testing involves verifying that the memory and controller timing margin and noise margin is met under various permutations of voltage, temperature, manufacturing tolerances, memory bus loading, and other parameters that affect signal timing or signal amplitude. Margin testing helps to ensure reliable operation when products containing the memory system are manufactured and used within their specified temperature, humidity, altitude, and other manufacturer specification limits. Since the emulator output driver simulation model will be already verified and a known quantity, this allows characterization of the system margins without the actual memory controller.

Embodiments of the present invention provide a low cost memory testing solution that allows a memory system to be operated at a primitive level and at full speed. Embodiments of the present invention allow memory testing to be performed before the memory technology support infrastructure exists. Thus, for example, testing can be performed on "DDR2" and other new memory technologies before complete memory systems have been constructed. Embodiments of the present invention operate at full speed (e.g., 200 MHz data transfer rate and 100 MHz command/address transfer rate for DDR applications).

In addition to emulating a memory controller, the techniques described herein may also be used to emulate a "fast skinny bus." A fast skinny bus is a high speed bus that is commonly used for communication between a memory input/output controller and a satellite memory device that buffers data, addresses and commands, or between a memory input/output controller and a satellite input/output device that buffers data, addresses and commands to PCI 133 MHz or 150 MHz input/output slots. A fast skinny bus is typically used in larger, higher speed systems, where the input/output slots and the memory modules cannot all be physically positioned in the same place next to the memory input/output controller, and where the number of pins needed is excessive. By limiting the number of bits, but running the bus at a faster rate, an equivalent throughput or bandwidth can be maintained. Applying the techniques of the present invention to a fast skinny bus would allow a system to be validated before the memory input/output controller is available.

Although specific embodiments have been illustrated and described herein for purposes of description of the preferred embodiment, it will be appreciated by those of ordinary skill in the art that a wide variety of alternate and/or equivalent implementations may be substituted for the specific embodiments shown and described without departing from the scope of the present invention. Those with skill in the chemical, mechanical, electro-mechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. A memory controller emulator for controlling memory devices in a memory system comprising:
   a counter for generating a plurality of address values; and
   a plurality of storage devices coupled to the counter for storing memory address information, memory data to be stored in the memory devices, and memory commands for controlling operation of the memory devices, each of the plurality of storage devices configured to output data stored therein based upon address values received from the counter.

2. The memory controller emulator of claim 1, wherein the memory controller emulator is a programmable logic device.

3. The memory controller emulator of claim 2, wherein the storage devices are ROMs.

4. The memory controller emulator of claim 3, wherein the memory commands, memory address information, and memory data stored in the ROMs are programmable by a computer.

5. The memory controller emulator of claim 1, wherein the memory data includes error correction code information.

6. The memory controller emulator of claim 1, wherein the memory address information includes row address information, column address information, and bank address information.

7. The memory controller emulator of claim 6, wherein the memory address information includes chip select information.

8. The memory controller emulator of claim 1, wherein one of the storage devices stores scope synchronization information to be output to an oscilloscope.

9. The memory controller emulator of claim 1, and further comprising:
   a clock input for receiving a clock signal; and
   a plurality of phase-locked loops coupled to the clock input for generating a plurality of clocks signals at different frequencies and different phase shifts.

10. The memory controller emulator of claim 9, wherein the frequencies and phase shifts of the clock signals generated by the plurality of phase-locked loops are programmable.

11. The memory controller emulator of claim 9, wherein the counter is coupled to a first one of the phase-locked loops, and wherein the counter is configured to output address values at transitions of the clock signal generated by the first phase-locked loop.

12. The memory controller emulator of claim 9, and further comprising:
   a plurality of output registers, each output register coupled to one of the storage devices and to one of the phase-locked loops, each output register configured to latch the output of the storage device at a clock transition of the clock signal generated by the phase-locked loop coupled to the output register.

13. The memory controller emulator of claim 1, wherein the plurality of address values include a start address and an end address, and wherein the start address and the end address are programmable.

14. The memory controller emulator of claim 1, wherein the memory data is stored in a first and a second storage device that each output memory data at a first output rate, the memory controller emulator further comprising:
   a multiplexer for selectively outputting data from the first and the second storage devices;
   a register for receiving memory data output by the multiplexer, the register outputting the received memory data at a second output rate that is about double the output rate of the first output rate.

15. The memory controller emulator of claim 1, wherein a first and a second storage device each output strobe signals at a first output rate, the memory controller emulator further comprising:
   a multiplexer for selectively outputting strobe signals from the first and the second storage devices;
   a register for receiving strobe signals output by the multiplexer, the register outputting the received strobe signals at a second output rate that is about double the output rate of the first output rate.

16. A method of emulating a memory controller for controlling memory devices in a memory system comprising:
    storing memory address information, memory data to be stored in the memory devices, and memory commands for controlling operation of the memory devices;
    automatically generating a plurality of sequential values; and
    outputting stored memory address information, memory data, and memory commands, based upon the generated sequential values.

17. The method of claim 16, wherein the method is implemented with a programmable logic device.

18. The method of claim 17, wherein the memory address information, memory data, and memory commands are stored in at least one ROM of the programmable logic device.

19. The method of claim 16, and further comprising:
    inputting memory address information, memory data, and memory commands, into a computer; and
    downloading the memory address information, memory data, and memory commands to a programmable logic device.

20. The method of claim 16, wherein the memory data includes error correction code information.

21. The method of claim 16, wherein the memory address information includes row address information, column address information, and bank address information.

22. The method of claim 21, wherein the memory address information includes chip select information.

23. The method of claim 16, and further comprising:
    storing scope synchronization information; and
    outputting stored scope synchronization information to an oscilloscope based upon the generated sequential values.

24. The method of claim 16, and further comprising:
    receiving a clock signal; and
    generating a plurality of clocks signals at different frequencies and different phase shifts with a plurality of phase-locked loops.

25. The method of claim 24, wherein the frequencies and phase shifts of the clock signals generated by the plurality of phase-locked loops are programmable.

26. The method of claim 24, and further comprising:
    outputting the sequential values at transitions of the clock signal generated by a first one of the phase-locked loops.

27. The method of claim 16, wherein the plurality of sequential values include a start value and an end value, and wherein the start value and the end value are programmable.

28. The method of claim 16, and further comprising:
    storing the memory data in odd and even banks, the odd and even banks each configured to output memory data at a first output rate; and
    providing a register for receiving memory data output by the odd and even banks, the register configured to output the received memory data at a second output rate that is about double the output rate of the first output rate.

29. The method of claim 16, and further comprising:
    storing strobe signals in odd and even banks, the odd and even banks each configured to output strobe signals at a first output rate; and
    providing a register for receiving strobe signals output by the odd and even banks, the register configured to output the received strobe signals at a second output rate that is about double the output rate of the first output rate.

30. A memory controller emulator comprising:
    at least one storage device for storing memory command information representing memory commands transmitted from a memory controller to a memory module; and
    an address generator coupled to the at least one storage device, the address generator configured to output address information, the at least one storage device configured to output memory command information based upon address information received from the address generator.

* * * * *